United States Patent [19]

Bang

[11] Patent Number: 5,157,400
[45] Date of Patent: Oct. 20, 1992

[54] AUTOMATIC REFERENCE VOLTAGE CONTROLLER OF INTEGRAL ANALOG/DIGITAL CONVERTER

[75] Inventor: Sam Y. Bang, Bucheon, Rep. of Korea

[73] Assignee: Samsung Electronics Co., Ltd., Kyungki, Rep. of Korea

[21] Appl. No.: 602,465

[22] Filed: Oct. 23, 1990

[30] Foreign Application Priority Data

Jan. 25, 1990 [KR] Rep. of Korea .................. 90-889

[51] Int. Cl.$^5$ ............................................ H03M 1/50
[52] U.S. Cl. ........................................ 341/166; 341/127
[58] Field of Search ............... 341/127, 128, 129, 166, 341/167, 168

[56] References Cited

U.S. PATENT DOCUMENTS

| | | | |
|---|---|---|---|
| 4,087,796 | 5/1978 | Brown | 324/990 X |
| 4,268,820 | 5/1981 | Hareyama | 341/168 |
| 4,357,600 | 11/1982 | Ressmeyer et al. | 341/129 |
| 4,364,028 | 12/1982 | Masuda et al. | 341/167 |
| 4,445,111 | 4/1984 | Swift et al. | 341/128 |
| 4,613,950 | 9/1986 | Knierim et al. | 341/166 |
| 4,661,803 | 4/1987 | Nishiyama et al. | 341/166 |
| 4,672,361 | 6/1987 | Kokubo et al. | 341/166 |
| 4,908,623 | 3/1990 | Ullestad | 341/167 |

FOREIGN PATENT DOCUMENTS 0003840 9/1979 European Pat. Off. ............ 341/166

*Primary Examiner*—Howard L. Williams
*Attorney, Agent, or Firm*—Ladas & Parry

[57] ABSTRACT

An automatic reference voltage controller of an integral A/D converter comprises a reference voltage switching circuit, an input voltage switching circuit, a Miller integrator, a comparing circuit, a logic circuit, and an automatic reference voltage control means for reducing the output error of the integral A/D converter. According to the present invention, the error of the digital output signal due to the limit error of the integral A/D converter can be reduce by automatic control of the reference voltage.

4 Claims, 4 Drawing Sheets

AUTOMATIC REFERENCE VOLTAGE CONTROLLER OF INTEGRAL ANALOG/DIGITAL CONVERTER

BACKGROUND OF THE INVENTION

The present invention relates to an analog/digital (A/D) converter of a digital multimeter and more particularly to an automatic reference voltage controller of the integral A/D converter which can control a reference voltage of the integral A/D converter automatically so as to reduce output errors of the multimeter due to limit errors of an amplifier of a Miller integrator in the integral A/D converter.

In a conventional integral A/D converter as shown in FIG. 1, a reference voltage switching circuit 1 is to switch a base voltage VC and a reference voltage VREF and an input voltage switching circuit 2 is to switch an input voltage VIN, the base voltages VC, and the reference voltage VREF. The reference voltage switching part 1 and the input voltage, switching part 2 are connected to a noninverting terminal (+) and an inverting terminal (−) of an operational amplifier OP of a Miller integrator 3, respectively.

The reference voltage switching circuit 1 comprises two switches S1 and S4. while the input voltage switching circuit 2 comprises three switches S2, S3 and S5.

The Miller integrator 3 is connected to a comparing circuit 4 with output terminals thereof and comprises the amplifier OP, a resistor R, and two capacitors C1 and C2. The comparing circuit 4 is to compare an output voltage of the input switching circuit 2 with an output voltage VO of the Miller integrator 3. The comparing circuit 4 comprises a comparator COMP1 and a feedback switch S6. A logic circuit 5 is connected to output terminals of the comparing circuit 4 so that an output of the comparing circuit 4 is stored in the logic circuit 5 to be provided as a digital signal after A/D conversion.

In this integral A/D converter, the switch S1 in the reference voltage switching circuit 1, the switch S2 in the input voltage switching circuit 2 are turned on at the same time for a predetermined period T1, as shown in FIG. 2A. That is, the noninverting terminal (+) of the Miller integrator 3 is applied with the base voltage VC and no current is supplied through the resistor R and the capacitor C1. Thus, the output voltage VO of the amplifier OP in the Miller integrator 3 is the same as the base voltage VC.

The output voltage VO of the Miller integrator 3 is provided to the noninverting terminal (+) of the comparator COMP1 in the comparing circuit 4 and compared with the base voltage VC applied to the inverting terminal (−) of the comparator COMP1. The comparing part 4 is provided with the base voltage VC, where the feedback switch S6 in the comparing circuit 4 is turned on so that the base voltage VC provided from the comparing part 4 is stored in the logic circuit part 5.

On the other hand, for a predetermined period T2, the switch S1 in the reference voltage switching part 1 and the switch S3 in the input voltage switching circuit 2 are turned on at the same time. Accordingly, the output base voltage VC of the reference voltage switching circuit 1 remains, while the output of the input voltage switching circuit 2 is changed to the input voltage VIN. Thus, the current flows through the resistor R and the capacitor C1 and the output voltage VO of the Miller integrator 3 is given by a linear function of time, as shown in FIG. 2B. That is, $$VO = -\frac{VIN}{RC1} t \ldots (T1 < t < T2)$$

The final value of the output voltage VO becomes $$Vo = -\frac{VIN \times T2}{RC1}$$

The output voltage VO of the Miller integrator 3 is compared with the input voltage VIN in the comparing circuit 4, and then output of the comparator COMP1 becomes a low level state as shown in FIG. 2C(A). The low level output of the comparing circuit 4 is stored in the logic circuit 5.

FIG. 2C(B) shows the output voltage of the comparator COMP1 in case that the input voltage VIN has a smaller value than the base voltage VC. In FIG. 2B, the output voltage VO of the Miller integrator 3 is shown by a linear function of time as follows:

$$VO = \frac{VIN}{RC1} t \ldots (T2 < t < T3),$$

where the final value is $$Vo = \frac{VIN \times T3}{RC1}$$

And the output voltage VO of the Miller integrator 3 is applied to the comparing circuit 4 and provided in a high level state as shown in FIG. 2C(B).

On the other hand, the switch S4 in the reference voltage switching circuit 1 and the switch S2 in the input voltage switching circuit 2 are turned on at the same time and the switches S2, S4 are turned off when the comparator provides a high level output. That is, the reference voltage of the Miller integrator 3 becomes an added value of the base voltages VC and the reference voltage VREF, while the input voltage VIN becomes the base voltage VC.

FIG. 2B(A) is shown a linear function of time for the output voltage VO of the Miller integrator 3, wherein $$VO = Vo' + \frac{1}{RC1} (VREF) t \ldots (T2 < t < T3)$$

where the Vo' is the final value of the period T2.

Similarly, the output of the Miller integrator 3 is compared with the reference voltage VREF in the comparing circuit 4 and provided to the logic circuit 5 to be stored, so that the comparing circuit 5 provides a digital output.

To the contrary, the switch S1 in the reference voltage switching circuit 1 and the switch S5 in the input voltage switching circuit 2 are turned on instead of the switches S2 and S4 if the input voltage VIN is smaller value the base voltage Vc during the period T2, the Miller integrator 3 is provided with an input voltage VREF+VO. Accordingly, the output voltage VO of the Miller integrator 3 is shown as follows:

$$VO = Vo' - \frac{VREF}{RC1} t \ldots (T2 < t < T3).$$

where the Vo' is the final value of the period T2.

Also, the output voltage VO of the Miller integrator 3 is applied to the comparing part 4 to be compared with the output voltage of the reference voltage switching circuit 1 and provided in a high level state.

FIG. 2B shows all the periods T1~T3. The digital output signals are provided by repeating these steps. But, there is a problem that the digital output signals can not agree with the input voltage VIN accurately due to the limit error of the amplifier OP in the Miller integrator 3. In order to solve this problem, the reference voltage VREF should be manually controlled.

SUMMARY OF THE INVENTION

The present invention has an object to provide an automatic reference voltage controller of an integral A/D converter which can automatically control reference voltages of a reference voltage switching circuit according to an input voltage.

According to the present invention, there is provided an automatic reference voltage controller of an integral A/D converter comprising: a reference voltage switching circuit; art input voltage switching circuit; a Miller integrator; a comparing circuit; a logic circuit;

and an automatic reference voltage control means for reducing the output error of the integral A/D converter due to the limit error of an amplifier in said Miller integrator by controlling automatically reference voltages of said reference voltage switching circuit.

BRIEF DESCRIPTION OF DRAWINGS

These and other objects, features, and advantages of the present invention will become more apparent from the following description for the preferred embodiments taken in conjunction with the accompanying drawings, in which.

DETAILED DESCRIPTION OF THE PREFERRED EMBODIMENT

The present invention will be now described in more detail with reference to the accompanying drawings.

Figure 3:
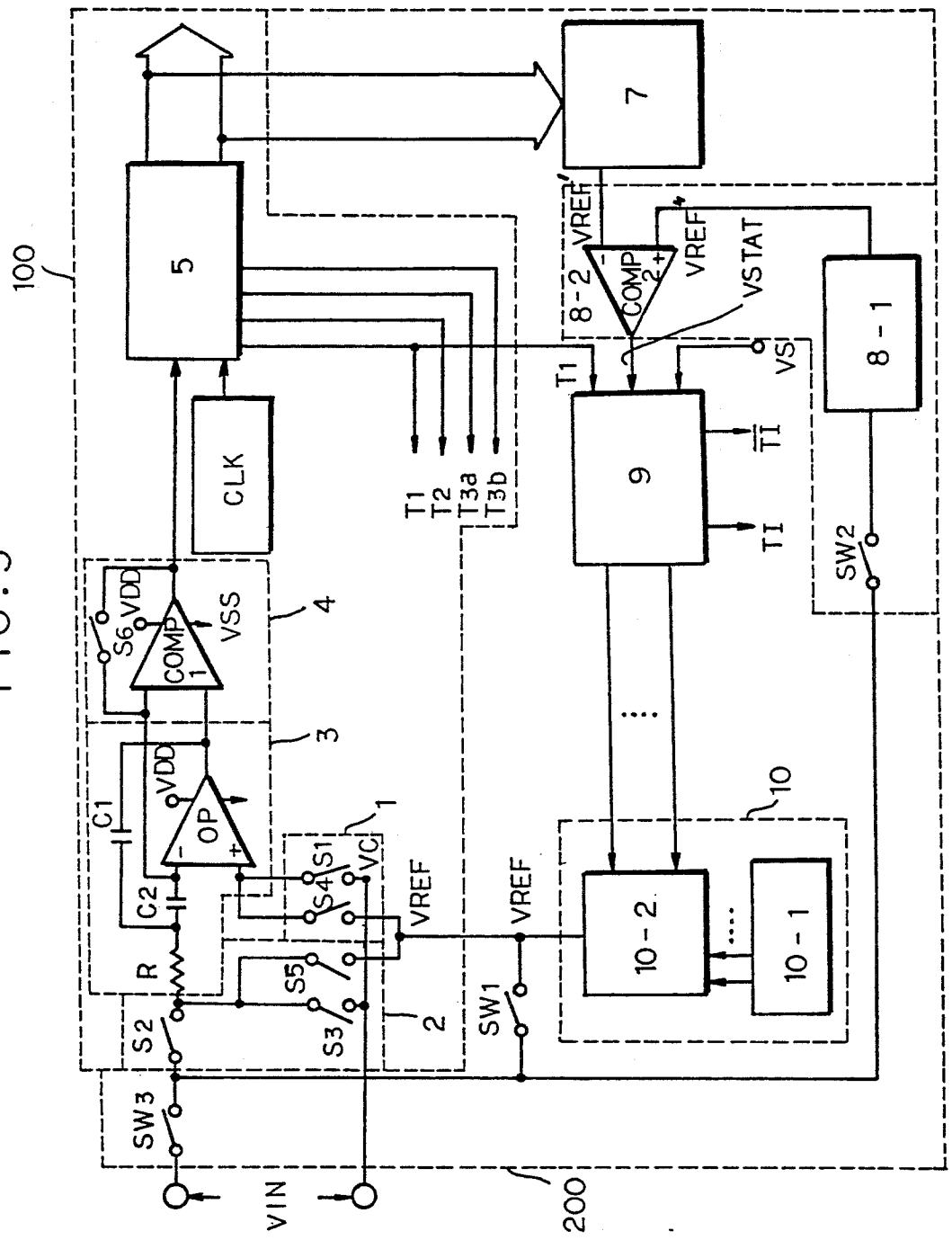
FIG. 3 is a detailed circuit diagram of the automatic reference voltage controller of an integral A/D converter according to the present invention.
Figure 4:
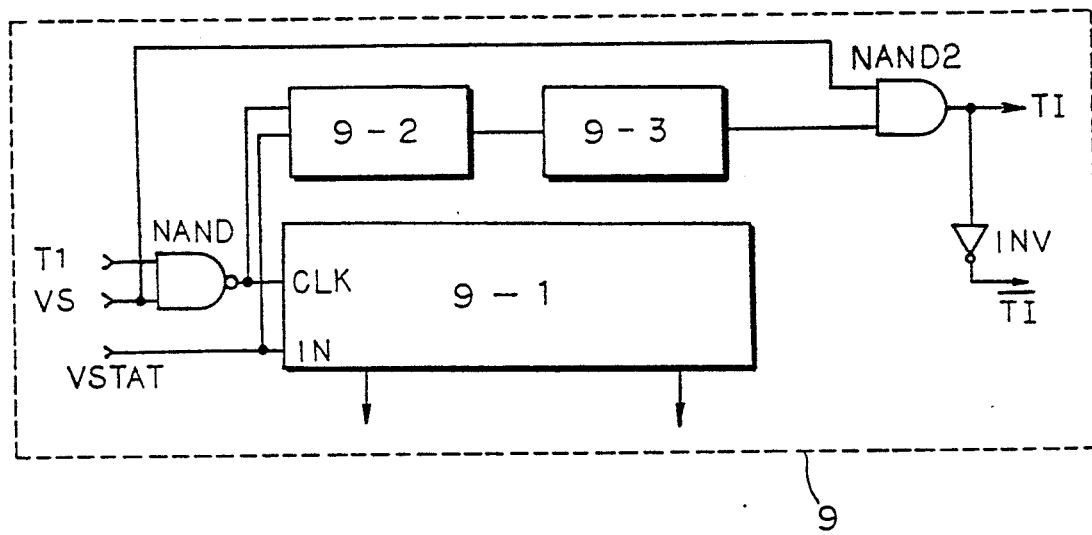
FIG. 4 is a detailed circuit diagram illustrating a control circuit as shown in FIG. 3.
Figure 5:
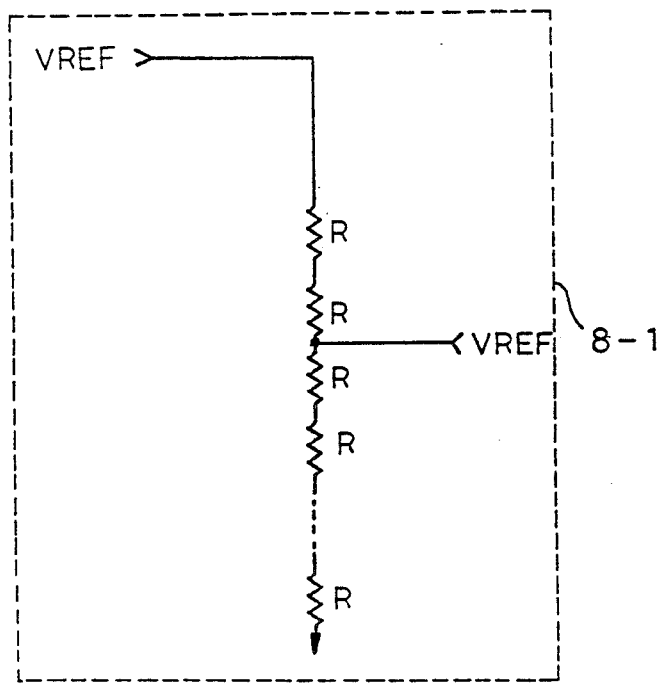
FIG. 5 is a detailed circuit diagram illustrating a voltage divider as shown in FIG. 3.

FIG. 3 shows an automatic reference voltage controller of an integral A/D converter according to the present invention. In FIG. 3 the integral A/D converter 100 comprises a reference voltage switching circuit 1, an input voltage switching circuit 2, a Miller integrator 3, a comparing circuit 4, and a logic circuit 5.

An automatic reference voltage control means 200 comprises a digital-to-analog D/A converter 7, a comparing circuit 8, a control circuit 9 and a reference voltage setting circuit 10. The comparing circuit 8 includes a voltage divider 8-1 and a comparator COMP2. The control circuit 9 includes a NAND gate, an up-/down counter 9-1, a binary counter 9-2, an edge detector 9-3, and an AND gate. The reference voltage setting circuit 10 includes a constant voltage source 10-1 and a multiplexer 10-2.

To describe in more detail, the reference voltage switching circuit 1 is to connect a base voltage VC and a reference voltage VREF to each other and to a noninverting terminal (+) of an amplifier OP in the Miller integrator 3. The input voltage switching circuit 2 is connected to an inverting terminal (−) of the amplifier OP and selects an input voltage thereof from an input voltage VIN, the reference voltage VREF and the base voltage VC.

The reference voltage switching circuit 1 includes two switches S1 and S4, and the input voltage switching circuit 2 includes three switches S2, S3 and S5. The Miller integrator 3 includes the amplifier OP, a resistor R and two capacitors C1 and C2. Next, the comparing circuit 4 is to compare an output voltage VO of the Miller Integrator 3 with the output voltage of the input voltage switching circuit 2 and is connected to an output terminal of the Miller integrator 3. This comparing circuit 4 includes a comparator COMP1 and a feedback switch S6. Also, a logic circuit 5 is connected to the comparing circuit 4 so as to store the output signal from the comparing circuit 4 and to provide it as a digital signal. In addition, a n-bit D/A converter is connected to an output terminal of the logic circuit 5, for converting n-bit digital signals out of m-bit digital signals to analog signals.

Moreover, an output terminal of the D/A converter 7 is connected with a comparing part 8-2 of the comparing circuit 8, so as to compare an output voltage of the D/A converter 7 with the reference voltage applied to the reference voltage switching circuit 1 in the integral A/D converter 100.

The comparing part 8-2 is connected to the output terminal of the voltage divider 8-1 and includes a comparator COMP2. The comparator COMP2 is connected with the control circuit 9 and the NAND gate which is actuated by an automatic control driving signal VS for automatically controlling the reference voltage VREF and an output signal T1 of the logic circuit 5 in the integral A/D converter 100. An output terminal of the NAND gate is connected with the up/down counter 9-1 to be counted up or down according to the output signal of the NAND gate and the output signal Vstat of the comparator COMP2 in the comparing part 8-2.

Also, a binary counter 9-2 is connected to both the output terminals of the NAND gate and the comparator COMP2. Next, an edge detector and latch 9-3 is connected to the binary counter 9-2 for providing if the output signal of the binary counter 9-2 after delaying. That is, if the output signal of the edge detector and latch 9-3 is a high level state, the reference voltage VREF automatically is controlled, while the output signal becomes a low level state when the automatic control of the reference voltage VREF is completed.

Figure 1:
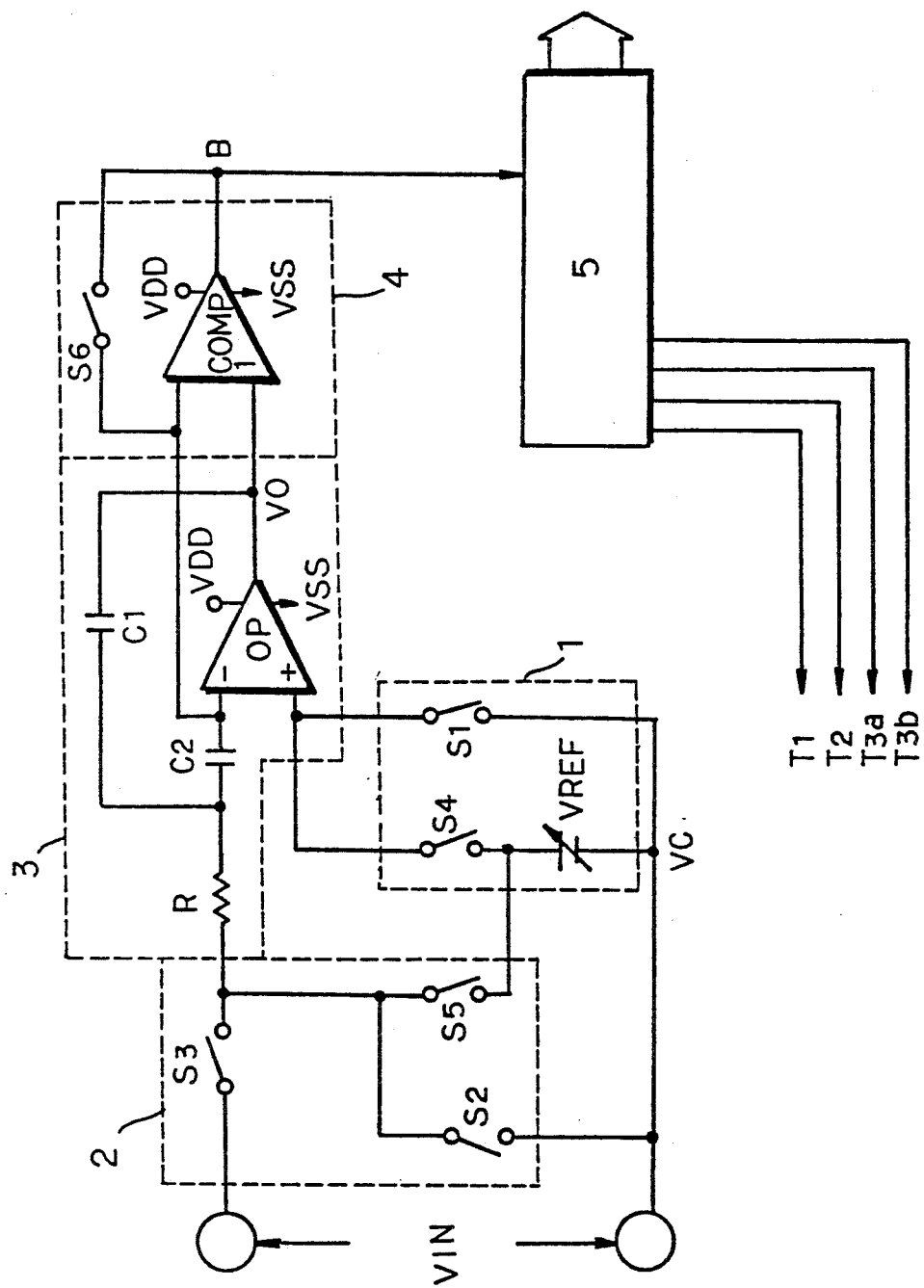
FIG. 1 is a detailed circuit diagram illustrating a conventional integral A/D converter.
Figure 2A:
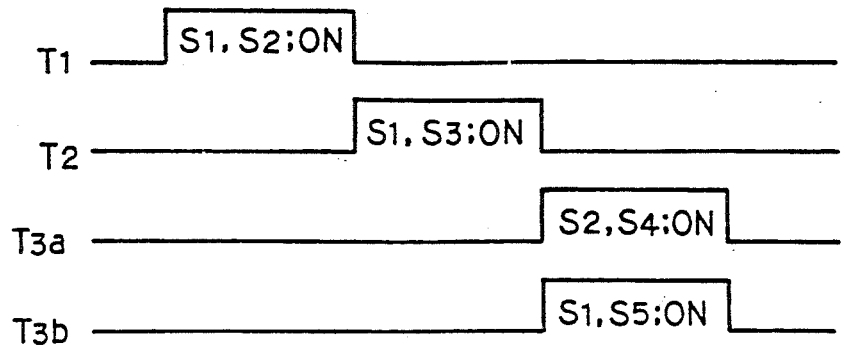
FIG. 2A is a diagram illustrating input waveforms of the conventional integral A/D converter.
Figure 2B:
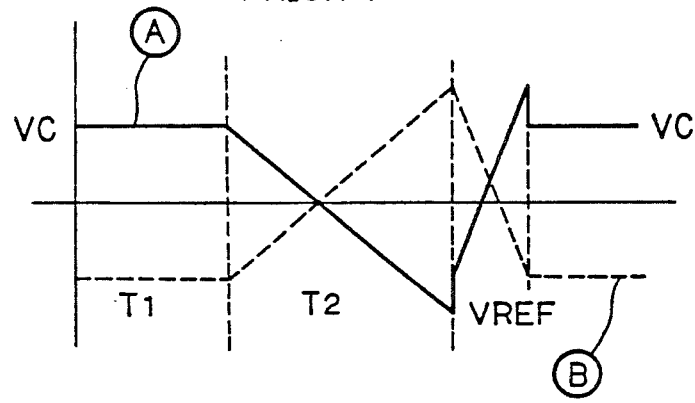
FIG. 2B is diagram illustrating output waveforms of a Miller integrator as shown in FIG. 1.
Figure 2C:
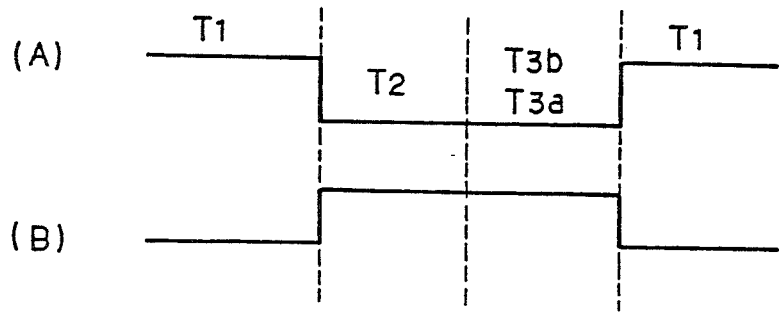
FIG. 2C is a diagram illustrating output waveforms of the comparing circuit as shown in FIG. 1.

The output terminal of the edge detector and latch 9-3 and the automatic control driving signal VS for controlling the reference voltage VREF are applied to two input terminals of the NAND 2 gate, respectively. If the output signal T1 of the NAND 2 gate is in the high level state, the reference voltage VREF is applied to the inverting terminal (−) of the amplifier OP in the Miller integrator 3 for the predetermined period T1 as shown in FIG. 2, while if it is in the low level state the input voltage VIN is applied to the inverting terminal (−) of the amplifier OP and inverted into a normal state.

On the other hand, a multiplexer 10-2 is interposed between the constant voltage source 10-1 for providing N reference voltages and the up/down counter 9-1 of the control circuit 9, so that one of n reference voltages is selected as the reference voltage VREF. The reference voltage setting circuit 10 includes the constant voltage source 10-1 and the multiplexer 10-2.

The reference voltage VREF provided from the multiplexer 10-2 in the reference voltage setting circuit 10 is applied to the switches S4 and S5 in the reference voltage and input voltage switching circuits 1 and 2. If the output signal TI of the control circuit 9 is in the high level state, the switches SW1, SW2 are turned on so that the controlled reference voltage VREF in the control circuit 200 is applied to the Miller integrator 3 and the voltage divider 8-1 is supplied with VRED as a feedback voltage.

Moreover, the switch SW3 is interposed between the switch S2 of the input voltage switching circuit 2 and the input terminal of the input voltage VIN for providing the input voltage VIN to the inverting terminal (−) of the Miller integrator 3 for the predetermined period T2 according to an output signal TI of the control circuit 9.

In this invention, if the logic circuit 5 provides a digital signal, the automatic reference voltage control means 200 is driven to control the reference voltage VREF automatically. Therefore, the automatic control driving signal applied to the control circuit 9 is set in a high level state.

Then, the initial set signals of the control circuit 9 is applied to the multiplexer 10-2 and an initial reference voltage VREF1 is applied to the integral A/D converter 100. At this time, the output of the NAND gate in the control circuit 9 is in a low level state and applied to the clock terminal CLK of the binary counter 9-2. Thus, the driving of the binary counter 9-2 is stopped and the output of the edge detector and latch 9-3 becomes a low level state.

And, the output of the NAND 2 gate in the control circuit 9 is set to a high level state, thereby turning on the switches SW1 connected the output terminal of the multiplexer 10-2 and the switch SW2 connected to the switch SW1. At this time, the switch SW3 is turned off so that the input voltage VIN is not applied to the input terminal of the Miller integrator 3 for the predetermined period T2 as shown in FIG. 2. Therefore, the initial reference voltage VREF1 is applied to the input terminal of the Miller integrator 3 for the period T2 in the integral A/D converter 100.

On the other hand, the initial reference voltage VREF1 is applied to the voltage divider 8-1 which is connected to a terminal of the switch SW2 and subsequently an output VREF'' from the voltage divider 8-1 is applied to the comparator COMP2, where the output voltage VREF'' of the voltage divider 8-1 is determined by a ratio of a digital output number of the logic circuit 5 to a selected output number as follows:

$$VREF' = VREF1 \times \left(\frac{n}{m}\right).$$

Also, the initial reference voltage VREF1 which is applied to the Miller integrator 3 is provided as a digital signal through the logic circuit 5 in the integral A/D converter 100. This digital signal is converted to an analog signal VREF' by the n-bit D/A converter 7.

The analog voltage VREF' of the D/A converter 7 is compared with the output signal VREF'' of the voltage divider 8-1 by the comparator COMP2, where the output signal Vstat of the comparing part 8-2 is applied to the up/down counter 9-1 so that the counter 9-1 counts up or down according to the output signal Vstat of the comparing circuit 8.

Therefore, if the output signal VREF'' is larger than the output signal VREF' of the D/A converter 7, the output signal Vstat of the comparing part 8-2 is in a high level state and the up/down counter 9-1 counts down since the initial reference voltage VREF1 is regarded to be very large.

But, if the output signal VREF' of the D/A converter 7 is smaller than the output signal VREF'' of the voltage dividing part 8-1, the output signal Vstat of the comparing part 8-2 is in a low level state and the up/down counter 9-1 counts up since the initial reference voltage VREF1 is regarded to be very small.

Thus, the output signal of the control circuit 9 is applied to the multiplexer 10-2 in the reference voltage setting circuit 10, thereby selecting again one of n reference voltages of the constant voltage source 10-1. This selected reference voltage is applied to the reference voltage switching circuit 1 in the integral A/D converter 100. These steps are repeated until the output voltage VREF'' of the voltage dividing part 8-1 is agreed with the output voltage VREF' of the D/A converter 7.

That is, if the up/down counter 9-1 counts down and thus the reference output voltage of the reference voltage setting circuit 10 is reduced, making the output voltage VREF'' of the voltage divider 8-1 smaller than the output voltage VREF' of the D/A converter 7, the output Vstat of the comparator COMP2 in the comparing circuit 8 becomes a low level state and the up/down counter 9-1 in the control circuit 9 enters into a latched state.

Similarly, if the up/down counter 9-1 counts up and thus the output voltage VREF'' of 'the voltage divider 8-1 is larger than the output voltage VREF', the output signal Vstat of the comparator COMP2 becomes a high level state and the up/down counter 9-2 also enters into the latched state, where the control signal of the multiplexer 10-2 is fixed. In addition, the reference output voltage VREF of the reference voltage setting circuit 10 is fixed. The reference voltage VREF is converted to a digital signal in logic circuit 5 of the integral A/D converter.

The digital output of the integral A/D converter 100 is applied to the comparator COMP 2 in the comparing circuit 8 after digital-to-analog conversion in the D/A converter 7. If the output signal Vstat of the comparator COMP2 is variable, the reference voltage VREF is reset but if it is fixed, the output signal of the edge detector and latch 9-3 in the control circuit becomes a high level state and the output of the NAND 2 gate is provided as a low level state so that the switches SW1 and SW2 are turned off.

On the other hand, the switch SW3 is turned on by the inverted signal TI which is provided through inverter INV converted to the output terminal of the NAND 2 gate. Thus, the input voltage VIN is applied to the integral A/D converter 100 through the switch SW3 and the A/D converter 100 performs normal operations.

As mentioned hereinabove, the present invention can reduce the error of the digital output signal due to the limit error of the integral A/D converter by controlling the reference voltage automatically. In addition, the present invention can be widely applicable to the conventional integral A/D converters by simply connecting automatic reference voltage control means to the output stage of the conventional A/D converters.

The present invention is in no way limited to the embodiment described hereinabove. Various modifications of the disclosed embodiment as well as other embodiments of the present invention will become apparent to persons skilled in the art upon reference to the description of the invention. It is therefore contemplated that the appended claims will cover any such modifications or embodiments as fall within the true scope of the invention.

What is claimed is:

1. An automatic reference voltage controller of an integral A/D converter comprising a reference switching circuit, an input voltage switching circuit converting a fixed base voltage and a variable reference voltage, a Miller integrator, a first comparing circuit, and a logic circuit, the improvement comprising:
   a D/A converter for providing a digital output of the logic circuit as an analog signal, said D/A converter being connected to said logic circuit;
   a second comparing circuit for comparing an output of said D/A converter with a reference voltage;
   a control circuit including means for counting up or down depending on an output of the second comparing circuit, and a counter being clocked by a timing signal of said logic circuit, and generating a switching signal from a state of said output of said second comparing circuit;
   a reference voltage setting circuit for varying and outputting a reference voltage according to a value of a count of said control circuit;
   a first switch means being switched according to a switching signal of said control circuit, in order to control the reference voltage of said reference voltage setting circuit to be applied to said second comparing circuit and said voltage switching circuit;
   a second switch means connected to the first switch means and being switched according to a switching signal generated by the control circuit; and
   a third switch means being switched according to a switching signal of said control circuit, in order to control an input voltage to be applied to said input voltage switching circuit.

2. An automatic reference voltage controller as claimed in claim 1, wherein the second comparing circuit includes a voltage divider connected to the second switch means for dividing a reference voltage applied from the second switch means, and a comparator for comparing outputs of the D/A converter and the voltage divider.

3. An automatic reference voltage controller as claimed in claim 1, wherein the control circuit includes a NAND gate for combing an automatic control driving logic signal and a timing signal of the logic circuit, an up/down counter for counting up or down according to an output logic of the comparator, a binary counter for providing an output signal of the comparator by clock-delaying, by having an output signal of the NAND gate as clock signal, an edge detector and latch means for inverting and outputting a signal logic level being provided when an output level of the binary counter is changed, an inverter for inverting and providing an output of the latch means.

4. An automatic reference voltage controller according to claim 1, wherein said reference voltage setting circuit comprises:
   a constant voltage generating means for providing a plurality of reference voltages; and
   a multiplexer for selecting one of said reference voltages from said constant voltage generating means according to an output of said control circuit.

* * * * *